United States Patent
Noh

(10) Patent No.: US 9,818,966 B2
(45) Date of Patent: Nov. 14, 2017

(54) LIGHT-EMITTING DISPLAY DEVICE AND METHOD OF FABRICATING THE SAME

(71) Applicant: SAMSUNG DISPLAY CO., LTD., Yongin-si, Gyeonggi-do (KR)

(72) Inventor: Seung Uk Noh, Seoul (KR)

(73) Assignee: SAMSUNG DISPLAY CO., LTD., Yongin-Si, Gyeonggi-Do (KR)

(*) Notice: Subject to any disclaimer, the term of this patent is extended or adjusted under 35 U.S.C. 154(b) by 0 days.

(21) Appl. No.: 15/169,898

(22) Filed: Jun. 1, 2016

(65) Prior Publication Data

US 2017/0125719 A1     May 4, 2017

(30) Foreign Application Priority Data

Oct. 30, 2015   (KR) .................. 10-2015-0151820

(51) Int. Cl.
| | | |
|---|---|---|
| *H01L 51/50* | (2006.01) | |
| *H01L 27/32* | (2006.01) | |
| *H01L 51/52* | (2006.01) | |
| *H01L 51/56* | (2006.01) | |

(52) U.S. Cl.
CPC ...... *H01L 51/5088* (2013.01); *H01L 27/3211* (2013.01); *H01L 27/3246* (2013.01); *H01L 51/5275* (2013.01); *H01L 51/56* (2013.01); *H01L 2227/323* (2013.01)

(58) Field of Classification Search
CPC .......... H01L 51/5088; H01L 27/3246; H01L 51/5275; H01L 27/3211; H01L 51/56; H01L 2227/323
See application file for complete search history.

(56) References Cited

U.S. PATENT DOCUMENTS

| | | | |
|---|---|---|---|
| 9,494,830 B2 * | 11/2016 | Yamazaki | |
| 2014/0027725 A1 * | 1/2014 | Lim .................. | H01L 51/5284 257/40 |

FOREIGN PATENT DOCUMENTS

| | | |
|---|---|---|
| KR | 10-2006-0114086 A | 11/2006 |
| KR | 10-2010-0135680 A | 12/2010 |

* cited by examiner

*Primary Examiner* — Roy Potter
(74) *Attorney, Agent, or Firm* — Lee & Morse, P.C.

(57) ABSTRACT

A light-emitting display device comprises: a substrate including a plurality of pixel areas arranged in a first direction and a second direction intersecting the first direction; a first electrode on the substrate in each of the plurality of pixel areas; a plurality of pixels corresponding to the first electrode in each of the plurality of pixel areas; a pixel defining layer on the substrate having a pixel opening exposing the first electrode; a lens layer on the first electrode in the pixel opening, a thickness in a center of the lens layer being different from a thickness at an edge of the lens layer; a planarization layer on the lens layer in the pixel opening and having a flat surface facing away from the lens layer; a light emitting layer on the planarization layer; and a second electrode on the light emitting layer.

20 Claims, 17 Drawing Sheets

LIGHT-EMITTING DISPLAY DEVICE AND METHOD OF FABRICATING THE SAME

CROSS-REFERENCE TO RELATED APPLICATION

Korean Patent Application No. 10-2015-0151820, filed on Oct. 30, 2015, in the Korean Intellectual Property Office, and entitled: "Light-Emitting Display Device and Method of Fabricating the Same," is incorporated by reference herein in its entirety.

BACKGROUND

1. Field

Exemplary embodiments relate to a light-emitting display device and a method of fabricating the same.

2. Description of the Related Art

Among light-emitting display devices, organic light-emitting display devices emit light on their own, and they have wide viewing angle, good contrast ratio, and fast response speed.

An organic light-emitting display device may include a light emitting layer made of an organic luminescent substance between an anode electrode and a cathode electrode. Holes injected from the anode electrode migrate to the light emitting layer via a hole injection layer and a hole transport layer in response to a positive voltage applied thereto, while electrons injected from the cathode electrode migrate to the light emitting layer via an electron injection layer and an electron transport layer in response to a negative voltage applied thereto. Then, the electrons and holes recombine in the light emitting layer. As a result of the recombination, excitons are created. The excitons emit energy in the form of light as they change from an excited state to a ground state in the light emitting layer, so that an image is displayed.

An organic light-emitting display device may include a pixel defining layer having an opening. An anode electrode formed in each of pixels arranged in a matrix on a substrate is exposed via the opening. On the anode electrode exposed via the pixel opening of the pixel defining layer, a hole injection layer, a hole transport layer, an light emitting layer, an electron transport layer, an electron injection layer and a cathode electrode are formed in this order.

SUMMARY

Exemplary embodiments may provide a light-emitting display device comprising: a substrate including a plurality of pixel areas arranged in a first direction and a second direction intersecting the first direction; a first electrode on the substrate in each of the plurality of pixel areas; a plurality of pixels corresponding to the first electrode in each of the plurality of pixel areas; a pixel defining layer on the substrate having a pixel opening exposing the first electrode; a lens layer on the first electrode in the pixel opening, a thickness in a center of the lens layer being different from a thickness at an edge of the lens layer; a planarization layer on the lens layer in the pixel opening and having a flat surface facing away from the lens layer; a light emitting layer on the planarization layer; and a second electrode on the light emitting layer.

A surface of the lens layer that faces the planarization layer may be a curved surface being closer to the light emitting layer at the center than at the edge of the lens layer, and the thickness in the center of the lens layer may be a largest thickness of the lens layer and the thickness at the edge of the lens layer may be a smallest thickness of the lens layer.

The plurality of pixels may include a first pixel and a second pixel emitting light of different colors, and the lens layer in the first pixel may have the largest thickness in the center of the lens layer, and the second pixel may have a largest thickness of the lens layer in the center different from the largest thickness in the center of the lens layer in the first pixel.

The lens layer may be formed by ejecting a hole injection solution containing a hole injection material onto the first electrode and drying the hole injection solution, and the pixel defining layer may include an insulative material that has a lyophobic property to the hole injection solution.

A surface of the lens layer that faces the planarization layer may be a curved surface being closer to the light emitting layer at the edge that at the center of the lens layer, and the thickness in the center of the lens layer may be a smallest thickness of the lens layer and the thickness at the edge of the lens layer may be a largest thickness of the lens layer.

The lens layer may be formed by ejecting a hole injection solution containing a hole injection material onto the first electrode and drying the hole injection solution, and the pixel defining layer may include an insulative material that has a lyophilic property to the hole injection solution.

The planarization layer may include a same material as the lens layer.

The first electrode may include a transparent electrode material, and the second electrode may include a reflective electrode material.

Exemplary embodiments may also provide a light-emitting display device comprising: a substrate including a plurality of pixel areas arranged in a first direction and a second direction intersecting the first direction, the substrate having a first surface and a second surface facing the first surface; a first electrode on the first surface of the substrate in each of the pixel areas; a plurality of pixels corresponding to the first electrode in each of the plurality of pixel areas; a pixel defining layer on the first surface of the substrate and having a pixel opening exposing the first electrode; a light emitting layer on the first electrode; a second electrode on the light emitting layer; a partitioning wall on the second surface of the substrate and having a partitioning wall opening exposing a part of the second surface of the substrate corresponding to the first electrode; and a lens layer on the second surface of the substrate in the partitioning wall opening, wherein a thickness in a center of the lens layer is different from a thickness at an edge of the lens layer.

A surface of the lens layer exposed via the partitioning wall opening may be a curved surface closer to the light emitting layer at the center that at the edge of the lens layer, and the thickness in the center of the lens layer may be a smallest thickness of the lens layer and the thickness at the edge of the lens layer may be a largest thickness of the lens layer.

The plurality of pixels may include a first pixel and a second pixel emitting light of different colors, and the lens layer in the first pixel may have the smallest thickness in the center of the lens layer, and the second pixel may have a smallest thickness of the lens layer in the center different from the smallest thickness in the center of the lens layer in the first pixel.

The lens layer may be formed by ejecting a lens solution containing a lens material onto the second surface of the substrate and drying the lens solution, and the partitioning wall may include an insulative material that has a lyophilic property to the lens solution.

A surface of the lens layer exposed via the partitioning wall opening may be a curved surface closer to the light emitting layer at the edge than at the center of the lens layer, and the thickness in the center of the lens layer may be a largest thickness of the lens layer and the thickness at the edge of the lens layer may be a smallest thickness of the lens layer.

The lens layer may be formed by ejecting a lens solution containing a lens material onto the second surface of the substrate and drying the lens solution, and the partitioning wall may include an insulative material that has a lyophobic property to the lens solution.

The first electrode may include a transparent electrode material, and the second electrode may include a reflective material.

Exemplary embodiments may also provide a method of fabricating a light-emitting display device comprising: forming a first electrode in each of a plurality of pixel areas arranged on a substrate in a first direction and a second direction intersecting the first direction such that a corresponding plurality of pixels is formed; forming a pixel defining layer on the substrate, the pixel defining layer defining each of the pixels and having a pixel opening exposing the first electrode; forming a lens layer on the first electrode in the pixel opening, a thickness in a center of the lens layer being different from a thickness at an edge of the lens layer; forming a planarization layer on the lens layer in the pixel opening such that the planarization layer has a flat surface facing away from the lens layer; forming a light emitting layer on the planarization layer; and forming a second electrode on the light emitting layer.

The forming the lens layer and the forming the planarization layer may include ejecting a lens solution into the pixel opening using an ink print method or a nozzle print method and drying the lens solution.

The forming the lens layer may include ejecting a hole injection solution containing a hole injection material as the lens solution onto the first electrode and drying the hole injection solution, and the pixel defining layer may include an insulative material that has a lyophobic property to the hole injection solution.

The forming the lens layer may include ejecting a hole injection solution containing a hole injection material onto the first electrode and drying the hole injection solution, and the pixel defining layer may include an insulative material that has a lyophilic property to the hole injection solution.

The forming the lens layer and the forming the planarization layer may be performed using the same lens solution.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
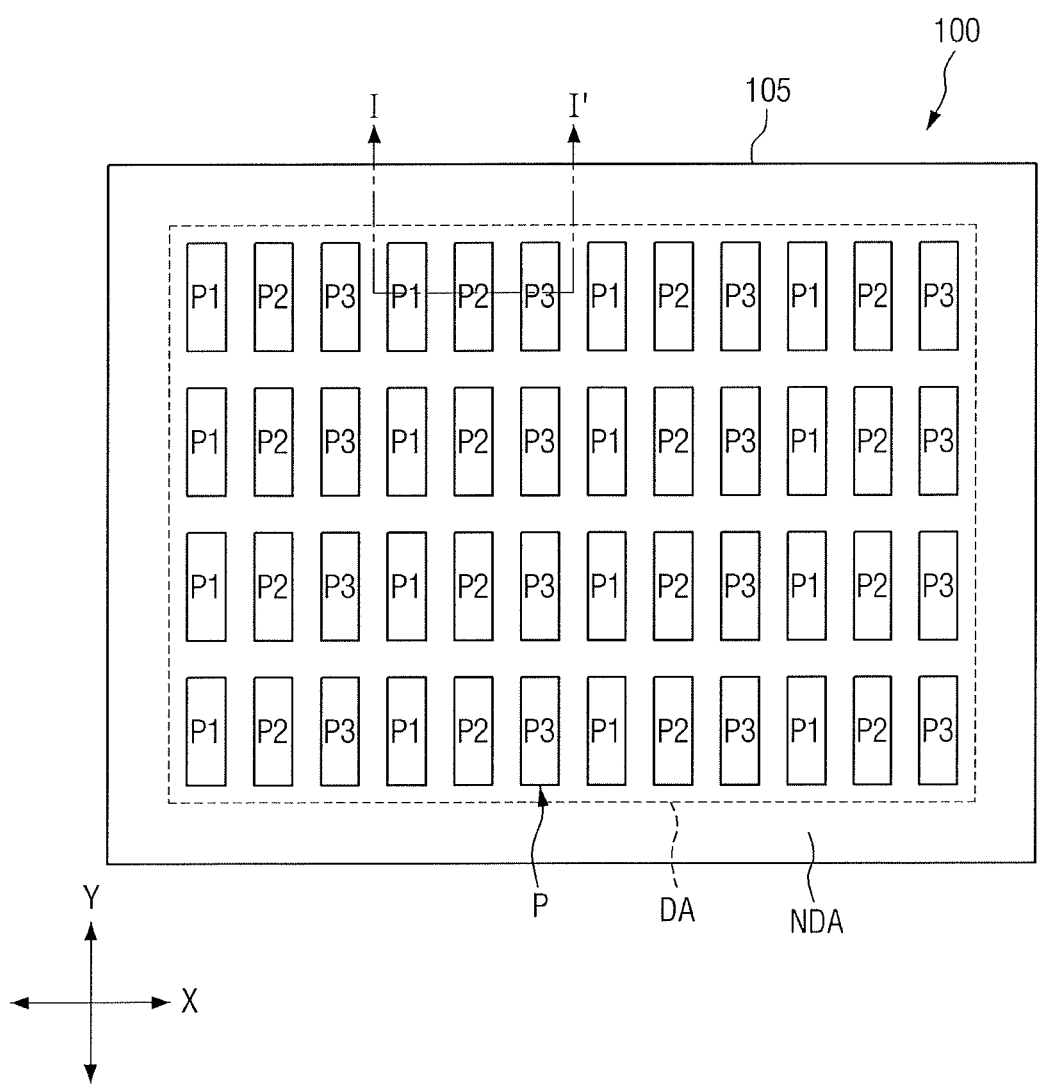
FIG. 1 illustrates a schematic plan view showing pixels of a light-emitting display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section. Like reference numerals refer to like elements throughout.

Figure 2:
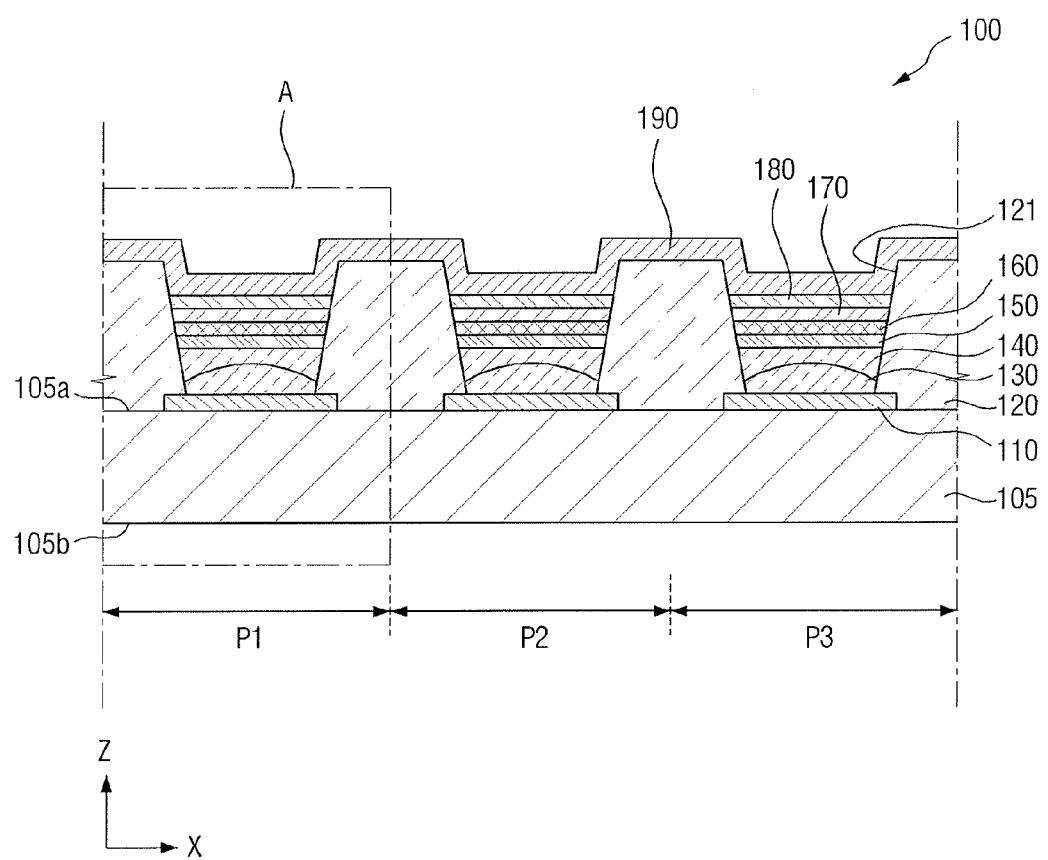
FIG. 2 illustrates a cross-sectional view taken along line I-I' of FIG. 1.
Figure 3:
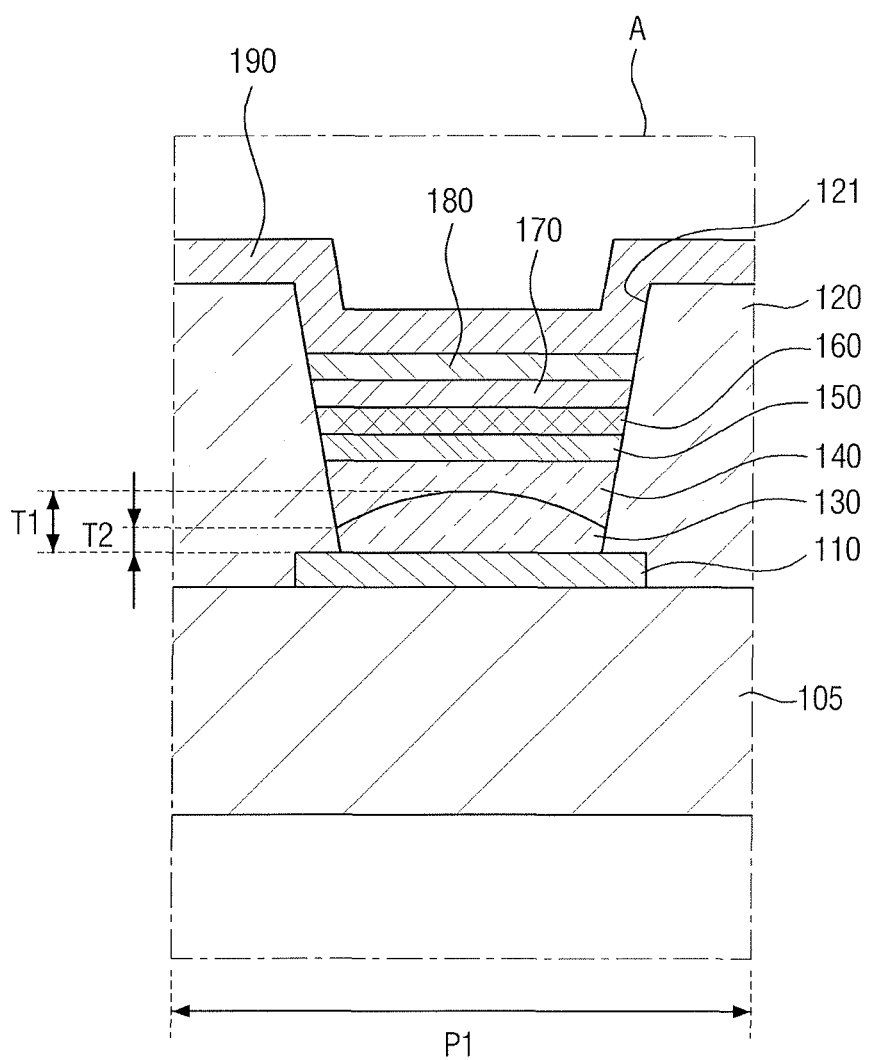
FIG. 3 illustrates an enlarged cross-sectional view of portion A of FIG. 2.

FIG. 1 is a schematic plan view showing pixels of a light-emitting display device according to an exemplary embodiment. FIG. 2 is a cross-sectional view taken along line I-I' of FIG. 1. FIG. 3 is an enlarged cross-sectional view of portion A of FIG. 2.

Referring to FIGS. 1 and 3, a light-emitting display device 100 according to an exemplary embodiment may include a substrate 105, a first electrode 110, a pixel defining layer 120, a lens layer 130, a planarization layer 140, a hole transport layer 150, a light emitting layer 160, an electron transport layer 170, an electron injection layer 180 and a second electrode 190. The elements may be stacked on one another in the above-mentioned order in the z-direction of FIG. 2, for example.

The substrate 105 may include a display area DA where a plurality of pixels P for displaying images may be defined, and a non-display area NDA located at the outer periphery of the display area DA. The plurality of pixels P may be arranged in a matrix along a first direction X and a second direction Y which intersects the first direction X and may include a first pixel P1, a second pixel P2 and a third pixel P3. For example, the first pixel P1 may be a red pixel for emitting light of a red color, the second pixel P2 may be a green pixel for emitting light of a green color, and the third pixel P3 may be a blue pixel for emitting light of a blue color.

Although the plurality of pixels P of FIG. 1 may include the first pixel P1, the second pixel P2 and the third pixel P3 that emit light of three different colors, exemplary embodiments are not limited thereto. For example, the plurality of pixels P may include the first pixel P1 and the second pixel P2 that emit light of two different colors. Although the pixels P arranged in the second direction Y may emit light of the same color while the pixels P arranged in the first direction X may emit light of different colors in FIG. 1, exemplary embodiments are not limited thereto.

The substrate 105 may include a first surface 105a and a second surface 105b opposed to the first surface 105a. The substrate 105 may be made of a transparent glass material composed mainly of transparent $SiO_2$, for example. In some embodiments, the substrate 105 may be made of an opaque material or a plastic material, for example. In addition, the substrate 105 may be a flexible substrate.

The substrate 105 may include other elements disposed on the first surface 105a. Other elements may include lines, electrodes, insulation films, etc. In some embodiments, the substrate 105 may include a plurality of thin-film transistors (TFT) disposed on the first surface 105a. Drain electrodes of at least some of the plurality of thin-film transistors may be electrically connected to the first electrodes 110, respectively. Each of the thin-film transistors may include an active region made of, for example, amorphous silicon, polycrystalline silicon or monocrystalline silicon, etc. In an alternative embodiment, each of the thin-film transistors may include an active region made of an oxide semiconductor, for example.

The first electrode 110 may be disposed on the first surface 105a of the substrate 105 for every pixel P. The first electrode 110 may be an anode electrode for injecting holes or a cathode electrode for injecting electrons into the light emitting layer 160 upon receiving a signal applied to the drain electrode of each of the thin-film transistors. In the exemplary embodiment, the first electrode 110 is the anode electrode.

The first electrode 110 may be used as a transparent electrode, a reflective electrode or transflective electrode. When the first electrode 110 is used as a transparent electrode, it may be made of a transparent electrode material such as, for example, indium tin oxide (ITO), indium zinc oxide (IZO), zinc oxide (ZnO) or $In_2O_3$. When the first electrode 110 is used as a reflective electrode, it may be made by forming a reflective film with a reflective electrode material, such as, for example, Ag, Mg, Al, Pt, Pd, Au, Ni, Nd, Ir, Cr or a compound thereof and then forming ITO, IZO, ZnO or $In_2O_3$ thereon. When the first electrode 110 is used as a reflective electrode, it may be made by forming a reflective film with a reflective electrode material, such as, for example, Ag, Mg, Al, Pt, Pd, Au, Ni, Nd, Ir, Cr or a compound thereof and then forming ITO, IZO, ZnO or $In_2O_3$ thereon. The first electrode 110 may be formed by, but is not limited to, a photolithography method, for example.

The first electrode 110 may be used as a transparent electrode when light-emitting display device 100 is a bottom emission display device in which light emitted from the light emitting layer 160 exits toward the first electrode 110. In addition, the first electrode 110 may be used as a reflective electrode when light-emitting display device 100 is a top emission display device in which light emitted from the light emitting layer 160 exits toward the second electrode 190. In the exemplary embodiment, the first electrode is used as a transparent electrode and the light-emitting display device 100 is a bottom emission display device.

The pixel defining layer 120 may be disposed on the first surface 105a of the substrate 105 with a pixel opening 121 in which the first electrode 110 may be exposed, and which may define each of the pixels P on the first surface 105a of the substrate 105. The pixel defining layer 120 may be made of an insulative material, for example.

According to the exemplary embodiment, the lens solution 130a (see FIG. 12) has a lyophobic property to the pixel defining layer 120, such that the lens layer 130 has the largest thickness T1 in its center and the smallest thickness T2 at its edge. The lens layer 130 may be produced via the process of forming the lens layer 130 including ejecting a lens solution containing a lens material 130a into the pixel opening 121 in the pixel defining layer 120 using an inkjet print method or a nozzle print method and drying the lens solution 130a. To this end, the pixel defining layer 120 may be made of an insulative material so that the contact angle made by the pixel defining layer 120 and the lens solution 130a (see FIG. 12) is about 50° or greater. The pixel defining layer 120 may be made of an organic insulative material such as a polymer resin containing fluorine, e.g., at least one of benzocyclobutane (BCB), polyimide (PI), polyamide (PA), acryl resin, and phenol resin. The pixel defining layer 120 may be formed by, but is not limited to, a photolithography method, for example. The inkjet print method may be carried out, for example, by dropping droplets of a printing ink onto a desired location. The nozzle print method may be carried out, for example, by flowing a print solution along a path passing through a desired location.

The lens layer 130 may be disposed on the first electrode 110 in the pixel opening 121. The thickness of the lens layer 130 in its center may be different from the thickness at its edge. For example, the lens layer 130 may have the largest thickness T1 in the center and may have the smallest thickness T2 at the edge. A surface of the lens layer 130 facing the first electrode 110 may be a flat surface. The other surface of the lens layer 130, i.e., the surface facing the planarization layer 140 may be a curved surface being away from light emitting layer 160 as it goes from the center to the edge of the lens layer 130, for example, the curved surface may be thicker in the center. The lens layer 130 may have the curved surface so that it works as a convex lens. The lens layer 130 may concentrate the light generated in the light emitting layer 160 onto the substrate 105, thereby improving light extraction efficiency of the light-emitting display device 100. Accordingly, the voltage applied to the first electrode 110 and the second electrode 190 for generating light in the light emitting layer 160 may be reduced, and thus the light-emitting display device 100 may be driven at a lower power.

The lens layer 130 may be formed by ejecting a lens solution 130a (see FIG. 12) containing a lens material into the pixel opening 121 in the pixel defining layer 120 by using an inkjet print method or a nozzle print method, for example, and drying the lens solution 130a. When the lens layer 130 is formed by using an inkjet print method or a nozzle print method, it is possible to form the lens layer 130 in a desired shape by adjusting a contact angle made by the pixel defining layer 120 and the lens solution.

For example, in FIG. 2, the pixel defining layer 120 may be an insulative material and the contact angle made by the pixel defining layer 120 and the lens solution 130a (see FIG. 12) may be about 50° or greater. As a result, the pixel defining layer 120 may have a lyophobic property to the lens solution 130a (see FIG. 12). Accordingly, the lens solution 130a (see FIG. 13) may be dried without spreading out to the edge of the pixel opening 121 of the pixel defining layer 120, so that the lens layer 130 has a convex shape with the center thicker than the edge.

Figure 12:
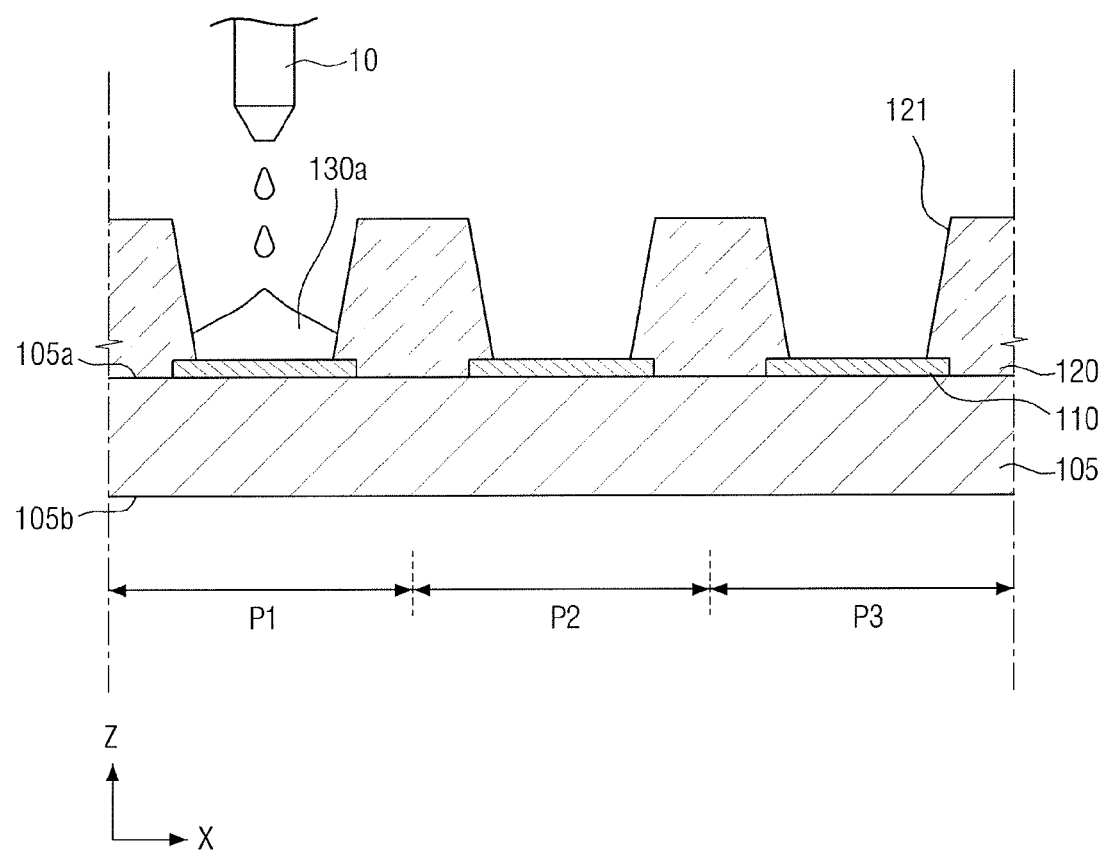

The lens layer 130 may be formed by using a hole injection solution containing a hole injection material as the lens solution 130a (see FIG. 12). The hole injection solution may be ejected onto the first electrode 110 and dried. Accordingly, the lens layer 130 may work as a hole injection layer.

The hole injecting layer may be a buffer layer for lowering the energy barrier between the first electrode 110 and the hole transport layer 150 and may facilitate injection of holes supplied from the first electrode 110 into the hole transport layer 150. The hole injection material may be made of, but is not limited to, an organic compound such as, for example, MTDATA(4,4',4"-tris(3-methylphenylphenylamino)triphenylamine), CuPc(copper phthalocyanine) or PEDOT/PSS (poly(3,4-ethylenedioxythiophene)/polystyrene sulfonate).

The planarization layer 140 may be disposed on the lens layer 130 in the pixel opening 121 and may have a flat surface. The planarization layer 140 may contain the same material as that of the lens layer 130 and may work as the hole injection layer together with the lens layer 130. The planarization layer 140 may allow the hole injection layer to have a uniform thickness.

The planarization layer 140 may be formed by ejecting a lens solution 140a (see FIG. 14) containing a lens material into the pixel opening 121 in the pixel defining layer 120 by using an inkjet print method or a nozzle print method, for example, and drying the lens solution 140a. The lens solution 140a (see FIG. 14) used in forming the planarization layer 140 may be a hole injection solution containing a hole injection material, for example.

Since the lens solution 140a (see FIG. 14) used in forming the planarization layer 140 may be the same as the lens solution 130a (see FIG. 12) used in forming the lens layer 130, the lens solution 140a (see FIG. 14) may not spread out to the edge of the pixel opening 121 of the pixel defining layer 120, so that the planarization layer 140 may have a shape with the center thicker than the edge. However, the planarization layer 140 may have a flat surface by adjusting drying conditions, such as adjusting a pressure for drying the lens solution 140a (see FIG. 14).

The hole transport layer 150 may be disposed on the planarization layer 140 in the pixel opening 121 of the pixel defining layer 120. The hole transport layer 150 may have a uniform thickness on the planarization layer 140. The hole transporting layer 150 may be formed by, but is not limited to, an inkjet print method or a nozzle print method. For example, the hole transport layer 150 may be formed by a deposition method.

The hole transport layer 150 may deliver holes supplied via the lens layer 130 and the planarization layer 140 to the light emitting layer 160. The hole transport layer 150 may be made of a hole transport material having an electric conductivity lower than that of the hole injection layer. The hole transport layer 150 may be made of, but is not limited to, an organic compound such as, for example, TPD(N,N'-diphenyl-N,N'-bis(3-methylphenyl)-1,1'-bi-phenyl-4,4'-diamine) or NPB(N,N'-di(naphthalen-1-yl)-N,N'-diphenyl-benzidine).

The light emitting layer 160 may be disposed on the hole transport layer 150 in the pixel opening 121 of the pixel defining layer 120. The light emitting layer 160 may have a uniform thickness on the hole transport layer 150. The light emitting layer 160 may be formed by, but is not limited to, an inkjet print method or a nozzle print method. For example, the light emitting layer 160 may be formed by a deposition method.

The light emitting layer 160 may emit light as the holes supplied from the first electrode 110 and the electrons supplied from the second electrode 190 recombine. For example, the holes and the electrons may be supplied into the light emitting layer 160 and may recombine to form excitons. The excitons may emit energy in the form of light as they change from an excited state to a ground state in the light emitting layer 160. The light emitting layer 160 may include a red light emitting layer emitting layer of a red color, a green light emitting layer emitting layer of a green color, and a blue light emitting layer emitting layer of a blue color.

The red light emitting layer may include a red luminous material or may include a host and a red dopant. The host of the red light emitting layer may include, but is not limited to, Alq3(tris(8-quinolinolate)aluminum), CBP(4,4'-N,N'-dicarbazol-biphenyl), PVK(ploy(n-vinylcarbazole)), ADN(9,10-Di(naphthyl-2-yl)anthrace), TCTA(4,4',4"-tris(N-carbazolyl)triphenylamine), TPBI(1,3,5-tris(N-phenylbenzimidazol-2-yl)benzene), TBADN(3-tert-butyl-9,10-di(naphth-2-yl) anthracene), E3(ter-fluorene), DSA (distyrylarylene), etc. The red dopant may include, but is not limited to, PtOEP, Ir(piq)3, Btp2Ir(acac).

The green light emitting layer may include a green luminous material or may include a host and a green dopant. The host of the red light emitting layer may be used as the host of the green light emitting layer. In addition, the green dopant may include, but is not limited to, Ir(ppy)3, Ir(ppy)2(acac), Ir(mpyp)3.

The blue light emitting layer may include a blue luminous material or may include a host and a blue dopant. The host of the red light emitting layer may be used as the host of the blue light emitting layer. In addition, the blue dopant may include, but is not limited to, F2Irpic, (F2ppy)2Ir(tmd), Ir(dfppz)3, ter-fluorene, DPAVBi(4,4'-bis(4-diphenylaminostyryl) biphenyl), TBPe(2,5,8,11-tetra-ti-butyl pherylene), etc.

The electron transport layer 170 may be disposed on the light emitting layer 160. The electron transport layer 170 delivers holes supplied from the second electrode 190 via the electron injection layer 180 to the light emitting layer 160. The electron transport layer 170 may be made of, but is not limited to, an organic compound such as, for example, Bphen(4,7-diphenyl-1,10-phenanthroline), BAlq(aluminum (III)bis(2-methyl-8-hydroxyquinolinato)4-phenylphenolate), Alq3(tris(8-quinolinolate)aluminum), Bebq2(berylliumbis(benzoquinolin-10-olate), TPBI(1,3,5-tris(N- phenylbenzimidazole-2-yl)benzene). The electron transport layer 170 may be formed by, but is not limited to, a deposition process.

The electron injection layer 180 may be disposed on the electron transport layer 170. The electron injecting layer 180 may be a buffer layer for lowering the energy barrier between the electron transport layer 170 and the second electrode 190 and may facilitate injection of electrons supplied from the second electrode 190 into the electron transport layer 170. The electron injection layer 180 may be formed by, but is not limited to, LiF or CsF. The electron injection layer 180 may be formed by, but is not limited to, a deposition method.

The second electrode 190 may be disposed on the electron injection layer 180 and may be a cathode electrode for supplying electrons or an anode electrode for supplying holes into the light emitting layer 160. Like the first electrode 110, the second electrode 190 may be used as a transparent electrode, a reflective electrode or transflective electrode. The second electrode 190 may be formed by, but is not limited to, a deposition process. As the light-emitting display device 100 according to the exemplary embodiment is a bottom emission display device, the second electrode 109 may be used as a reflective electrode.

The light-emitting display device 100 may further include a sealing substrate on the second electrode 190. The sealing substrate may be an insulative substrate. A spacer may be disposed between the second electrode 190 on the pixel defining layer 120 and the sealing substrate. In some embodiments, the sealing substrate may be eliminated. In that case, a sealing film made of an insulative material may cover the entire structure to protect it.

As described above, according to the exemplary embodiment, the light-emitting display device 100 may improve its light extraction efficiency by concentrating the light generated in the light emitting layer 160 onto the substrate 105 by virtue of the lens layer 130 that is disposed on the first electrode 110 in the pixel opening 121 and that works as a convex lens. Accordingly, the voltage applied to the first electrode 110 and the second electrode 190 for generating light in the light emitting layer 160 may be reduced and, thus, the light-emitting display device 100 may be driven at a lower power.

In addition, according to the exemplary embodiment, the light-emitting display device 100 may improve the luminous efficiency by implementing a hole injection layer having a uniform thickness, with the lens layer 130 working as a convex lens in the pixel opening 121 and the planarization layer 140 disposed on the lens layer 130, thereby flowing a uniform current via the first electrode 110. As a result, the display quality of the light-emitting display device 100 may be improved.

Figure 4:
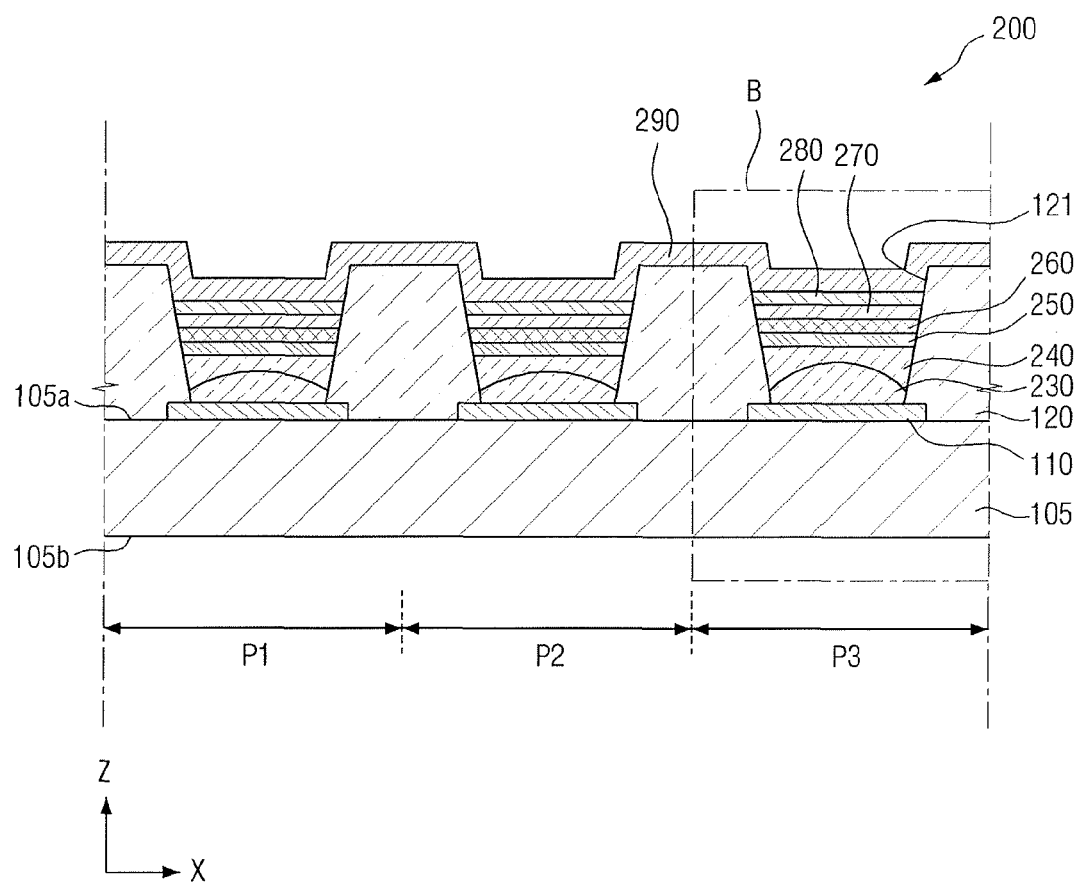
FIG. 4 illustrates a cross-sectional view of a portion of a light-emitting display device according to another exemplary embodiment, which corresponds to that shown in FIG. 2.
Figure 5:
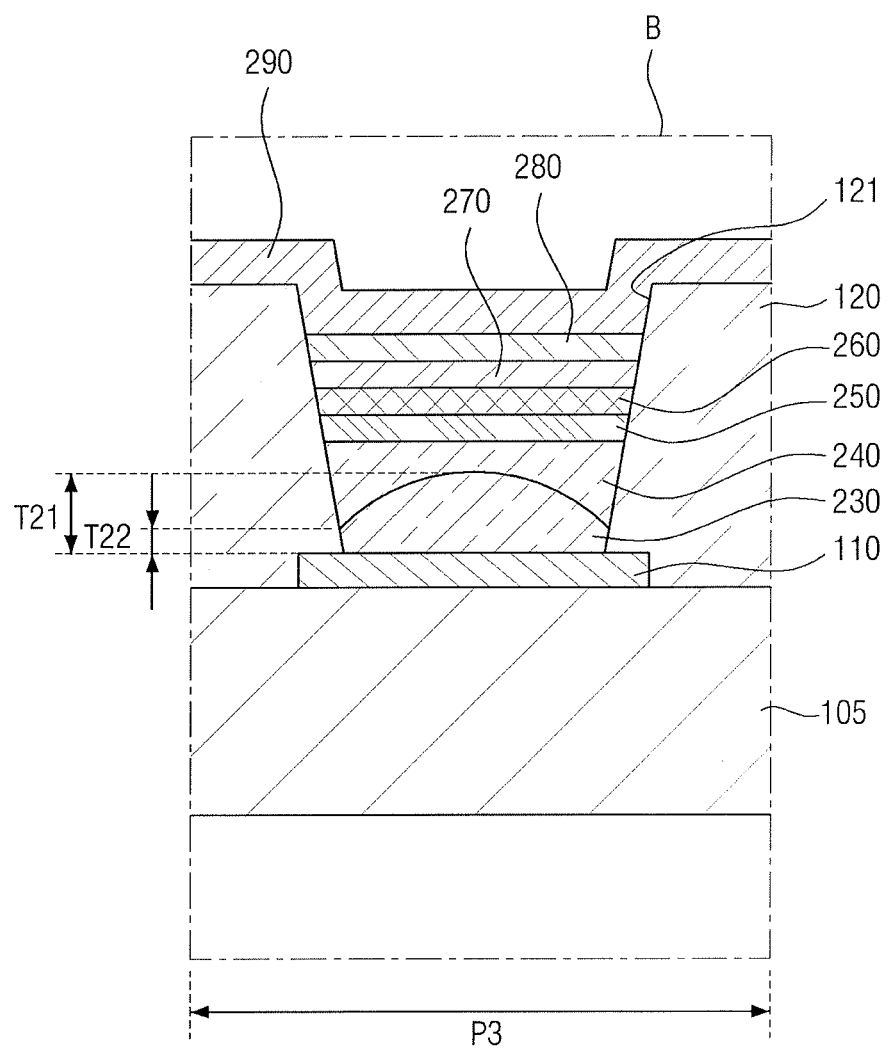
FIG. 5 illustrates an enlarged cross-sectional view of portion B of FIG. 4.

FIG. 4 is a cross-sectional view of a portion of a light-emitting display device according to another exemplary embodiment, which corresponds to that shown in FIG. 2. FIG. 5 is an enlarged cross-sectional view of portion B of FIG. 4.

Referring to FIGS. 4 and 5, a light-emitting display 200 according to another exemplary embodiment may be substantially identical to the light-emitting display device 100 shown in FIGS. 1 to 3 except for a lens layer 230, a planarization layer 240, a hole transport layer 250, a light emitting layer 260, an electron transport layer 270, an electron injection layer 280 and a second electrode 290. Therefore, the lens layer 230, the planarization layer 240, the hole transport layer 250, the light emitting layer 260, the electron transport layer 270, the electron injection layer 280 and the second electrode 290 of the light-emitting display device 200 according to the exemplary embodiment will be described.

The light-emitting display device 200 may include a substrate 105, a first electrode 110, a pixel defining layer 120, a lens layer 230, a planarization layer 240, a hole transport layer 250, a light emitting layer 260, an electron transport layer 270, an electron injection layer 280 and a second electrode 290. The elements may be stacked on one another in the above-mentioned order in the z-direction of FIG. 4, for example.

The lens layer 230 may be similar to the lens layer 130 shown in FIG. 2. However, the size of the lens layer 230 in some pixels differs from that of the other pixels. For example, the size of the lens layer 230 in the first pixel P1 or the second pixel P2 may differ from the size of the lens layer 230 in the third pixel P3. In this regard, the emission efficiency of the light emitted from the light emitting layer 260 in the third pixel P3 may be lower than the emission efficiency of the light emitted from the light emitting layer 260 in the first pixel P1 and the second pixel P2. For example, the light emitting layer 260 in the first pixel P1 may be a red light emitting layer for emitting light of a red color, the light emitting layer 260 in the second pixel P2 may be a green light emitting layer for emitting light of a green color, and the light emitting layer 260 in the third pixel P3 may be a blue light emitting layer for emitting light of a blue color.

For example, the lens layer 230 in the first pixel P1 or the second pixel P2 may have the largest thickness T1 (see FIG. 3) in its center and have the smallest thickness T2 at its edge, like the lens layer 130 shown in FIG. 3. In contrast, the lens layer 230 in the third pixel P3 may have the largest thickness T21 in its center and may have the smallest thickness T22 at its edge. The largest thickness T21 of the lens layer 230 in the third pixel P3 may be larger than the largest thickness T1 (see FIG. 3) of the lens layer 130 shown in FIG. 3. The smallest thickness T22 of the lens layer 230 in the third pixel P3 may be smaller than the smallest thickness T2 (see FIG. 3) of the lens layer 130 shown in FIG. 3.

The lens layer 230 increases the light extraction efficiency by concentrating the light emitted from the light emitting layer 260 onto the substrate 105 in the third pixel P3, where the emission efficiency of the light emitted from the light emitting layer 260 is lower than that of the first pixel P1 or the second pixel P2. By doing so, the light extraction efficiency of light emitted toward the substrate 105 via the lens layer 230 may be uniform across the first pixel P1, the second pixel P2 and the third pixel P3.

The planarization layer 240 may be similar to the planarization layer 140 shown in FIG. 2. However, the planarization layer 240 disposed in the pixel P3 may be at a higher position than the planarization layer 240 disposed in the first pixel P1 or the second pixel P2.

The hole transport layer 250 may be similar to the hole transport layer 150 shown in FIG. 2. However, the hole transport layer 250 disposed in the pixel P3 may be at a higher position than the hole transport layer 250 disposed in the first pixel P1 or the second pixel P2.

The light emitting layer 260 may be similar to the light emitting layer 160 shown in FIG. 2. However, the light emitting layer 260 disposed in the pixel P3 may be at a higher position than the light emitting layer 260 disposed in the first pixel P1 or the second pixel P2.

The electron transport layer 270 may be similar to the electron transport layer 170 shown in FIG. 2. However, the electron transport layer 270 disposed in the pixel P3 may be at a higher position than the electron transport layer 270 disposed in the first pixel P1 or the second pixel P2.

The electron injection layer 280 may be similar to the electron injection layer 180 shown in FIG. 2. However, the electron injection layer 280 disposed in the pixel P3 may be at a higher position than the electron injection layer 280 disposed in the first pixel P1 or the second pixel P2.

The second electrode 290 may be similar to the second electrode 190 shown in FIG. 2. However, the part of the second electrode 290 disposed in the pixel P3 may be at a higher position than the part of the second electrode 290 disposed in the first pixel P1 or the second pixel P2.

According to the exemplary embodiment, the light-emitting display device 200 may include the lens layer 230 having different sizes in some pixels, so that it is possible to make the extraction efficiency of light emitted toward the substrate 105 via the lens layer 230 uniform across the pixels having different emission efficiencies of the light emitted from the light emitting layer 260.

Figure 6:
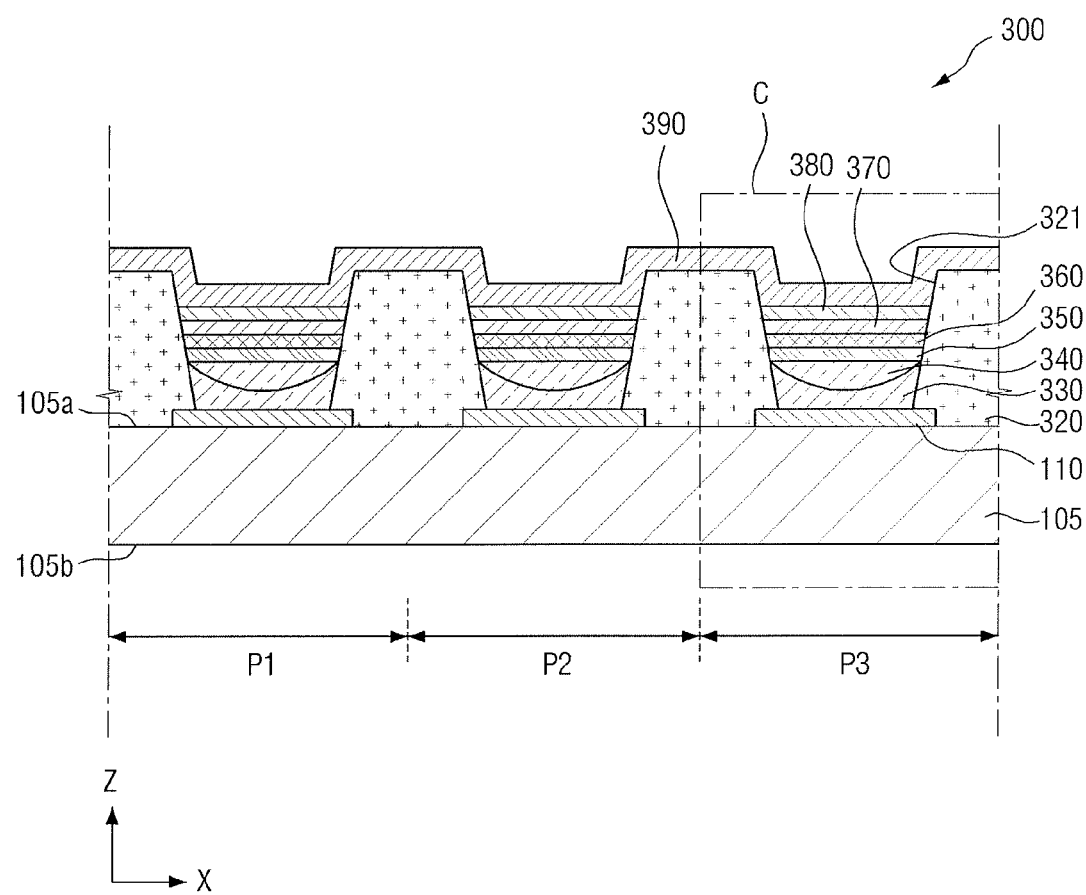
FIG. 6 illustrates a cross-sectional view of a portion of a light-emitting display device according to yet another exemplary embodiment, which corresponds to that shown in FIG. 2.
Figure 7:
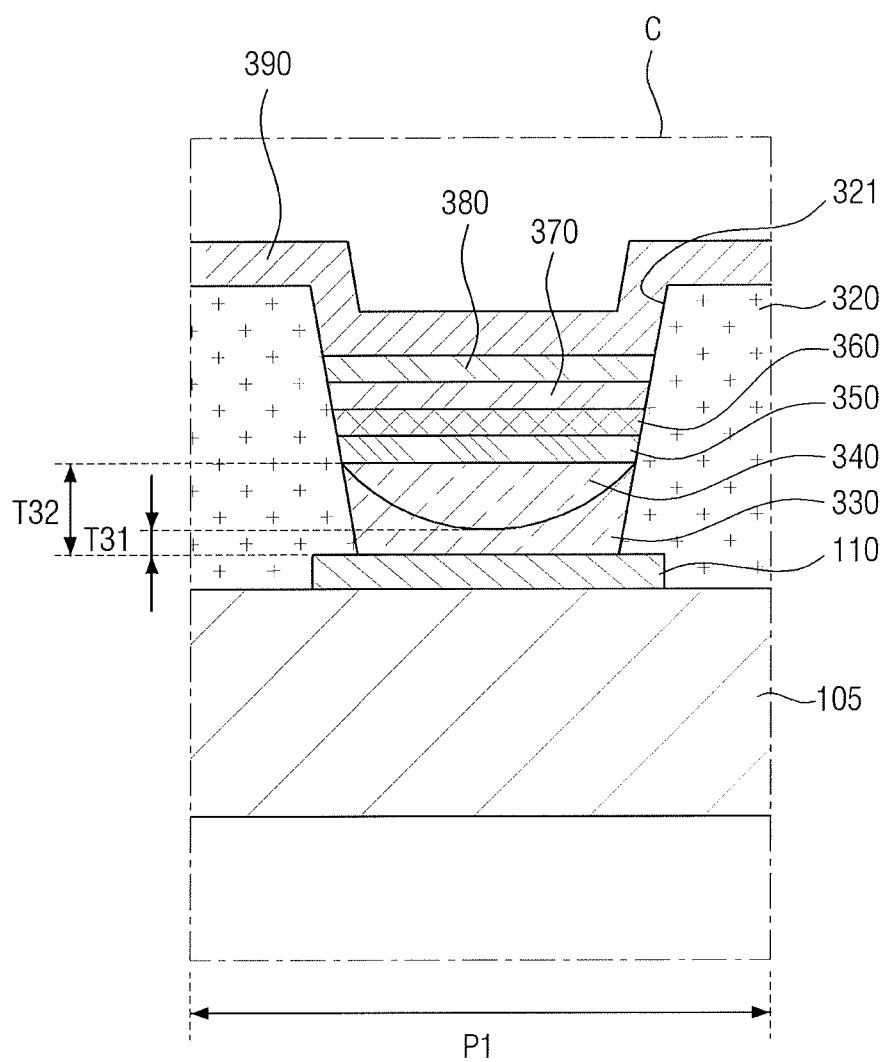
FIG. 7 illustrates an enlarged cross-sectional view of portion C of FIG. 6.

FIG. 6 is a cross-sectional view of a portion of a light-emitting display device according to still another exemplary embodiment, which corresponds to that shown in FIG. 2. FIG. 7 is an enlarged cross-sectional view of portion C of FIG. 6.

Referring to FIGS. 6 and 7, a light-emitting display 300 according to yet another exemplary embodiment may be substantially identical to the light-emitting display device 100 shown in FIGS. 1 to 3 except for a pixel defining layer 320, a lens layer 330, a planarization layer 340, a hole transport layer 350, a light emitting layer 360, an electron transport layer 370, an electron injection layer 380 and a second electrode 390. Therefore, the lens layer 330, the planarization layer 340, the hole transport layer 350, the light emitting layer 360, the electron transport layer 370, the electron injection layer 380 and the second electrode 390 of the light-emitting display device 300 according to the exemplary embodiment will be described.

The light-emitting display device 300 may include a substrate 105, a first electrode 110, a pixel defining layer 320, a lens layer 330, a planarization layer 340, a hole transport layer 350, a light emitting layer 360, an electron transport layer 370, an electron injection layer 380 and a second electrode 390. The elements may be stacked on one another in the above-mentioned order in the z-direction of FIG. 6, for example.

The pixel defining layer 320 may be disposed on the first surface 105a of the substrate 105 with a pixel opening 321 exposing the first electrode 110 and defining each of the pixels P (see FIG. 1) on the first surface 105a of the substrate 105. The pixel defining layer 320 may be made of an insulative material, for example.

According to the exemplary embodiment, the lens solution has a lyophilic property to the pixel defining layer 320 such that, in the process of forming the lens layer 330, the lens layer 330 may be formed such that it has the smallest thickness T31 in its center and the largest thickness T32 at the edge. The lens layer being formed by ejecting a lens solution containing a lens material into the pixel opening 121 of the pixel defining layer 320 using an inkjet print method or a nozzle print method and drying it. To this end, the pixel defining layer 320 may be made of an insulative material so that the contact angle made by the pixel defining layer 320 and the lens solution may be about 10° or less. The pixel defining layer 320 may be made of an organic insulative material, e.g., at least one of benzocyclobutane (BCB), polyimide (PI), polyamide (PA), acryl resin and phenol resin, or may be made of an inorganic insulative material, e.g., at least one of silicon oxide, silicon nitride and silicon oxynitride. The pixel defining layer 320 may be formed by, but is not limited to, a photolithography method.

The lens layer 330 may be disposed on the first electrode 110 in the pixel opening 321. The thickness of the lens layer 130 in its center may be different from the thickness at its edge. For example, the lens layer 330 may have the smallest thickness T31 in the center and may have the largest thickness T32 at the edge. A surface of the lens 330 facing the first electrode 110 may be a flat surface. The other surface of the lens layer 330, i.e., the surface facing the planarization layer 340 may be a curved surface being closer to the light emitting layer 160 as it goes from the center to the edge of the lens layer 330. For example, the curved surface may be thicker at the edge. The lens layer 330 may have the curved surface so that it works as a concave lens. The lens layer 330 diffuses the light generated in the light emitting layer 360 toward the substrate 105, thereby improving viewing angle of the light-emitting display device 300.

The lens layer 330 may be formed by ejecting a lens solution containing a lens material into the pixel opening 121 of the pixel defining layer 320 by using an inkjet print method or a nozzle print method, for example, and drying it. Since the lens layer 330 is formed by using an inkjet print method or a nozzle print method, it is possible to form the lens layer 130 in a desired shape by adjusting a contact angle made by the pixel defining layer 320 and the lens solution.

For example, in FIG. 6, the pixel defining layer 320 may be an insulative material such that the contact angle made by the pixel defining layer 320 and the lens solution may be about 10° or less. As a result, the pixel defining layer 320 has a lyophilic property to the lens solution. Accordingly, the lens solution may be dried in the pixel opening 321 of the pixel defining layer 320 in a shape spreading out to the edge, so that the lens layer 330 has a concave shape with the center thinner than the edge.

The lens layer 330 may be formed by using a hole injection solution containing a hole injection material as the lens solution and the hole injection solution may be ejected onto the first electrode 110 and dried. Accordingly, the lens layer 330 may work as a hole injection layer.

The planarization layer 340 may be disposed on the lens layer 330 in the pixel opening 321 and may have a flat surface. The planarization layer 340 may contain the same material as that of the lens layer 330 and may work as the hole injection layer together with the lens layer 330. The planarization layer 340 may allow the hole injection layer to have a uniform thickness.

The planarization layer 340 may be formed by ejecting a lens solution containing a lens material into the pixel opening 321 of the pixel defining layer 320 by using an inkjet print method or a nozzle print method, for example, and drying it. The lens solution used in forming the planarization layer 340 may be a hole injection solution containing a hole injection material.

Since the lens solution used in forming the planarization layer 340 may be the same as the lens solution used in forming the lens layer 330, the lens solution may spread out to the edge of the pixel opening 321 of the pixel defining layer 320 that has a lyophilic property to the lens solution, so that the planarization layer 140 has a shape with the center thinner than the edge. However, the planarization layer 340 may have a flat surface by adjusting drying conditions, such as adjusting a pressure for drying the lens solution.

The hole transport layer 350, the light emitting layer 360, the electron transport layer 370, the electron injection layer 380 and the second electrode 390 may be identical to the hole transport layer 150, the light emitting layer 160, the electron transport layer 170, the electron injection layer 180 and the second electrode 190 shown in FIG. 2. Therefore, descriptions of the identical elements will not be made to avoid redundancy.

As described above, according to the exemplary embodiment, the light-emitting display device 300 may improve the viewing angle by diffusing the light generated in the light emitting layer 360 toward the substrate 105 by virtue of the lens layer 330 that is disposed on the first electrode 110 in the pixel opening 321 and that works as a concave lens. Accordingly, the light-emitting display device 300 may be used when a wide viewing angle is required.

Figure 8:
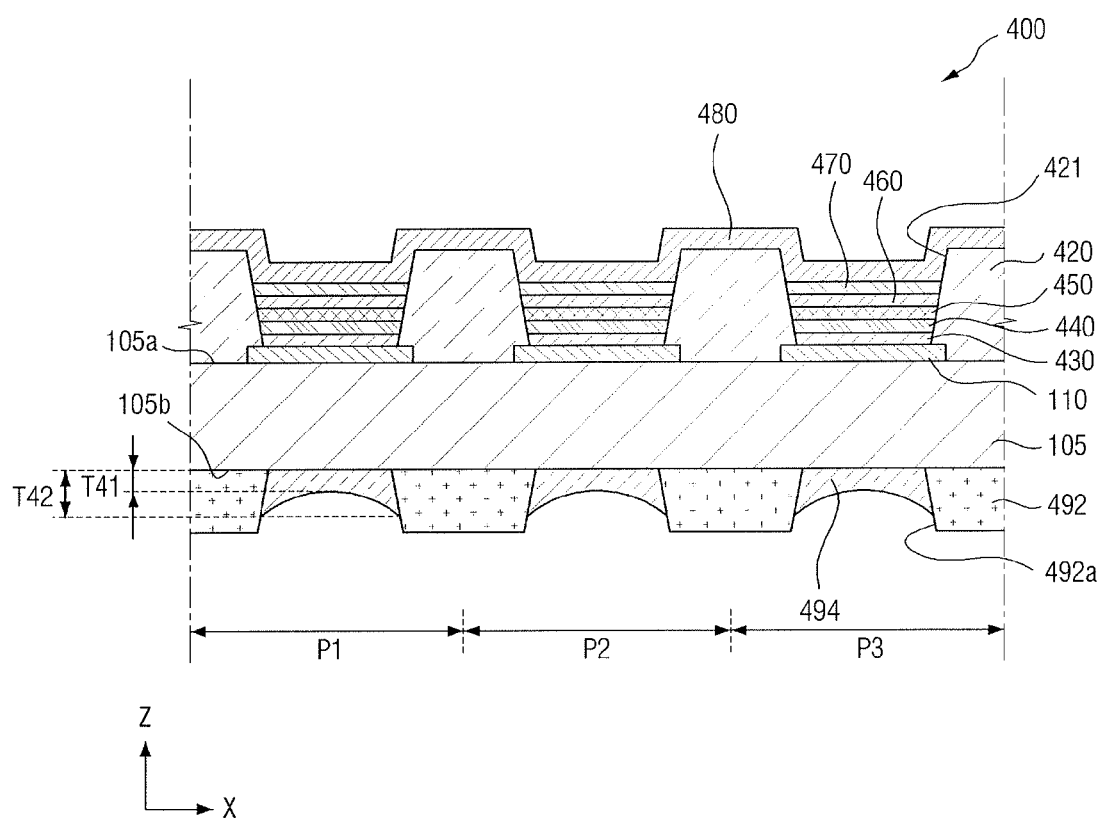
FIG. 8 illustrates a cross-sectional view of a portion of a light-emitting display device according to still another exemplary embodiment, which corresponds to that shown in FIG. 2.

FIG. 8 is a cross-sectional view of a portion of a light-emitting display device according to still another exemplary embodiment, which corresponds to that shown in FIG. 2.

Referring to FIG. 8, a light-emitting display 400 according to still another exemplary embodiment may include a substrate 105, a first electrode 110, a pixel defining layer 420, a hole injection layer 430, a hole transport layer 440, a light emitting layer 450, an electron transport layer 460, an electron injection layer 470, a second electrode 480, a partitioning wall 492, and a lens layer 494. The elements may be stacked on one another in the z-direction of FIG. 8, for example.

The substrate 105 and the first electrode 110 have been described above, and thus will not be described again.

The pixel defining layer 420 may be disposed on the first surface 105a of the substrate 105 with a pixel opening 421 in which the first electrode 110 may be exposed, and which defines each of the pixels P (see FIG. 1) on the first surface 105a of the substrate 105. The pixel defining layer 420 may be made of an insulative material, for example.

The hole injection layer 430 may be disposed on the first electrode 110 in the pixel opening 421 of the pixel defining layer 420.

The hole injection layer 430 may be formed by, but is not limited to, an inkjet print method or a nozzle print method. For example, the hole injection layer 430 may be formed by a deposition method. The hole injection layer 430 plays the same role as that of the hole injection layer comprised of the lens layer 130 and the planarization layer 140 shown in FIG. 2; and, therefore, a redundant description will be omitted.

The hole transport layer 440 may be disposed on the hole injection layer 430 in the pixel opening 421 of the pixel defining layer 420. The hole transport layer 440 may be identical to the hole transport layer 150 shown in FIG. 2; and, therefore, a redundant description will be omitted.

The light emitting layer 450 may be disposed on the hole transport layer 440 in the pixel opening 421 of the pixel defining layer 420. The light emitting layer 450 may be identical to the light emitting layer 160 shown in FIG. 2; and, therefore, a redundant description will be omitted.

The electron transport layer 460 may be disposed on the light emitting layer 450. The electron transport layer 460 may be identical to the electron transport layer 170 shown in FIG. 2; and, therefore, a redundant description will be omitted.

The electron injection layer 470 may be disposed on the electron transport layer 460. The electron injection layer 470 may be identical to the electron injection layer 180 shown in FIG. 2; and, therefore, a redundant description will be omitted.

The second electrode 480 may be disposed on the electron injection layer 470. The second electrode 480 may be identical to the second electrode 190 shown in FIG. 2; and, therefore, a redundant description will be omitted.

The partitioning wall 492 may be disposed on the second surface 105b of the substrate 105 and may have a partitioning wall opening 492a exposing a part of the second surface 105b of the substrate 105 corresponding to the first electrode. The partitioning wall 492 defines pixels P (see FIG. 1) on the second surface 105b of the substrate 105. The partitioning wall 492 may be made of an insulative material, for example.

According to the exemplary embodiment, the lens solution has a lyophilic property to the partitioning wall 492 such that the lens layer 494 has the smallest thickness T41 in its center and the largest thickness T42 at its edge. The lens layer 494 may be produced via the process of forming the lens layer 494 by ejecting a lens solution containing a lens material into the partitioning wall opening 492a of the partitioning wall 492 using an inkjet print method or a nozzle print method, for example. To this end, the partitioning wall 492 may be made of an insulative material so that the contact angle made by the partitioning wall 492 and the lens solution may be about 10° or less. The partitioning wall 492 may be made of an organic insulative material, e.g., at least one of benzocyclobutane (BCB), polyimide (PI), polyamide (PA), acryl resin and phenol resin, or may be made of an inorganic insulative material, e.g., at least one of silicon oxide, silicon nitride and silicon oxynitride. The partitioning wall 492 may be formed by, but is not limited to, a photolithography method.

The lens layer 494 may be disposed on the second surface 105b of the substrate 105 in the partitioning wall opening 492a. The thickness of the lens layer 494 in its center may be different from the thickness at its edge. The lens layer 494 may include a transparent or transflective material which may work as a lens. The lens layer 494 may have the smallest thickness T41 in its center and may have the largest thickness T42 at its edge. A surface of the lens layer 494 facing the second surface 105b of the substrate 105 may be a flat surface. The surface of the lens layer 494 exposed via the partitioning wall opening 492a may be a curved surface being away from the light emitting layer 450 as it goes from the center to the edge of the lens layer 494, for example, the curved surface may be thicker at the edge. The lens layer 494 has the curved surface so that it works as a convex lens. The lens layer 494 concentrates the light that is generated in the light emitting layer 450 to pass through the substrate 105 and then emit it, thereby improving light extraction efficiency of the light-emitting display device 400. Accordingly, the voltage applied to the first electrode 110 and the second electrode 480 for generating light in the light emitting layer 450 may be reduced and, thus, the light-emitting display device 400 may be driven at a lower power.

As described above, according to the exemplary embodiment, the light-emitting display device 400 may include the lens layer 494 disposed on the second surface 105b of the substrate 105, so that the light generated in the light emitting layer 450 may be concentrated at an outermost surface of the substrate 105 when the light is emitted toward the substrate 105, thereby further improving the light extraction efficiency. Accordingly, the voltage applied to the first electrode 110 and the second electrode 480 for generating light in the light emitting layer 450 may be reduced and, thus, the light-emitting display device 400 may be driven at a lower power.

In addition, according to the exemplary embodiment, the light-emitting display device 400 may include the lens layer 494 disposed on the second surface 105b of the substrate 105, so that it is possible to learn the emission efficiency of the light emitted from the light emitting layer 450 before forming the lens layer 494. As a result, after determining the emission efficiency of the light emitted, it is possible to form an appropriate lens layer 494 for the emission efficiency of the light emitted from the light emitting layer 450.

The lens layer 494 may be different in some pixels, similarly to the lens layer 230 of the light-emitting display device 200 shown in FIGS. 4 and 5. For example, the size of the lens layer 494 in the first pixel P1 or the second pixel P2 may differ from the size of the lens layer 494 in the third pixel P3. For example, the smallest thickness of the lens layer 494 in its center in the first pixel P1 or the second pixel P2 may differ from the smallest thickness of the lens layer 494 in its center in the third pixel P3.

Figure 9:
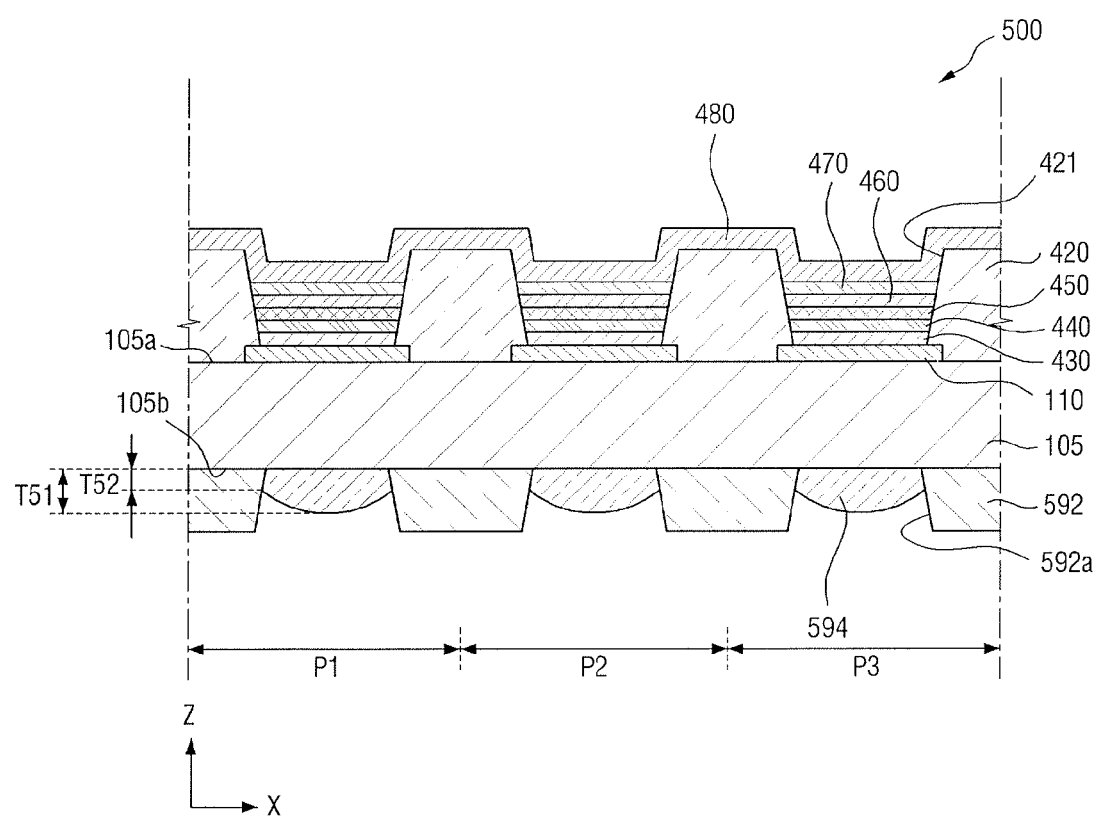
FIG. 9 illustrates a cross-sectional view of a portion of a light-emitting display device according to yet another exemplary embodiment, which corresponds to that shown in FIG. 2.

FIG. 9 shows a cross-sectional view of a portion of a light-emitting display device according to yet another exemplary embodiment, which corresponds to that shown in FIG. 2.

Referring to FIG. 9, a light-emitting display 500 according to yet another exemplary embodiment may include a substrate 105, a first electrode 110, a pixel defining layer 420, a hole injection layer 430, a hole transport layer 440, a light emitting layer 450, an electron transport layer 460, an electron injection layer 470, a second electrode 480, a partitioning wall 592, and a lens layer 594. The elements may be stacked on one another in the z-direction of FIG. 9, for example.

The substrate 105, the first electrode 110, the pixel defining layer 420, the hole injection layer 430, the hole transport layer 440, the light emitting layer 450, the electron transport layer 460, the electron injection layer 470 and the second electrode 480 have described above and, therefore, will not be described again to avoid redundancy.

The partitioning wall 592 may be disposed on the second surface 105b of the substrate 105 and may have a partitioning wall opening 592a exposing a part of the second surface 105b of the substrate 105 corresponding the first electrode 110. The partitioning wall 592 defines pixels P (see FIG. 1) on the second surface 105b of the substrate 105. The partitioning wall 592 may be made of an insulative material, for example.

According to the exemplary embodiment, the lens solution may have a lyophobic property to the partitioning wall 592 such that, in the process of forming the lens layer 594, the lens layer 594 may be formed such that it has the largest thickness T51 in its center and the smallest thickness T52 at its edge. The lens layer 594 may be formed by ejecting a lens solution containing a lens material into the partitioning wall opening 592a of the partitioning wall 592 using an inkjet print method or a nozzle print method, for example. To this end, the partitioning wall 592 may be made of an insulative material so that the contact angle made by the partitioning wall 592 and the lens solution may be about 50° or greater. The partitioning wall 592 may be made of an organic insulative material such as a polymer resin containing fluorine, e.g., at least one of benzocyclobutane (BCB), polyimide (PI), polyamide (PA), acryl resin, and phenol resin. The partitioning wall 592 may be formed by, but is not limited to, a photolithography method.

The lens layer 594 may be disposed on the second surface 105b of the substrate 105 in the partitioning wall opening 592a. The thickness of the lens layer 594 in its center may be different from the thickness at its edge. The lens layer 594 may have the largest thickness T51 in its center and may have the smallest thickness T52 at its edge. A surface of the lens layer 594 facing the second surface 105b of the substrate 105 may be a flat surface. The surface of the lens layer 594 exposed via the partitioning wall opening 592a may be a curved surface being closer to the light emitting layer 450 as it goes from the center to the edge of the lens layer 594, for example, the curved surface may be thicker in the center. The lens layer 594 may have the curved surface so that it works as a concave lens. The lens layer 594 may diffuse the light that is generated in the light emitting layer 450 toward the substrate 105, thereby improving the viewing angle of the light-emitting display device 500.

As described above, according to the exemplary embodiment, the light-emitting display device 500 may include the lens layer 594 disposed on the second surface 105b of the substrate 105, so that the light generated in the light emitting layer 450 may be diffused at the outermost surface of the substrate 105 when the light is emitted toward the substrate 105, thereby further improving the viewing angle.

Hereinafter, a method for fabricating the light-emitting display device according to the exemplary embodiments will be described.

FIGS. 10 to 17 are cross-sectional views and perspective views for illustrating processes of a method for fabricating a light-emitting display device according to an exemplary embodiment.

Figure 10:
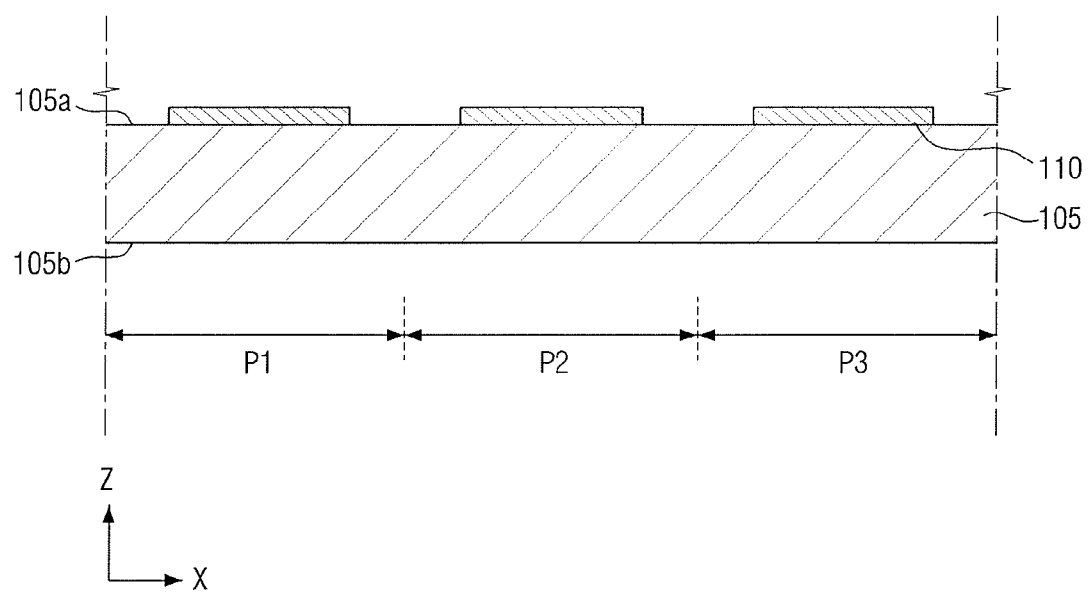
FIGS. 10 to 17 illustrate cross-sectional views and perspective views for illustrating processes of a method for fabricating a light-emitting display device according to an exemplary embodiment.

Referring to FIG. 10, a first electrode 110 may be formed in each of a plurality of pixels P (see FIG. 1) defined on a first surface 105a of a substrate 105. The first electrode 110 may be formed by depositing a transparent electrode material or a reflective material on the substrate 105 to pattern it. In the exemplary embodiment, the first electrode 110 may be made of a transparent electrode material.

Figure 11:
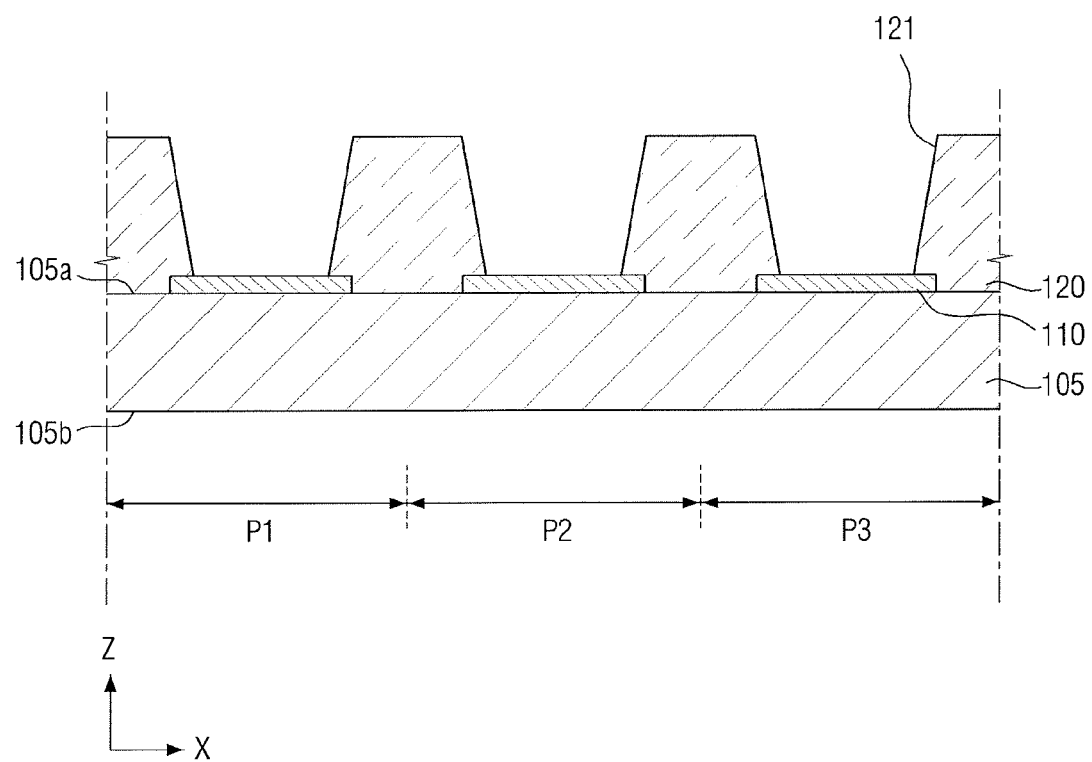

Referring to FIG. 11, a pixel defining layer 120 may be formed, which defines each of the pixels P (see FIG. 1) on the substrate and has a pixel opening in which the first electrode 110 may be exposed. The pixel defining layer 120 may be formed, for example, by depositing an insulative material on the entire surface of the first surface 105a of the substrate 105 by using a deposition method so that it covers the first electrode 110 and patterning the deposited, insulative material.

The pixel defining layer 120 may be formed by an insulative material that has a lyophobic property to the lens solution 130a (see FIG. 12) by using an inkjet print method or a nozzle print method, for example, so that the lens layer 130 has the largest thickness in its center T1 (see FIG. 3) and the smallest thickness T2 (see FIG. 3) at its edge. Alternatively, the pixel defining layer may be formed by an insulative material that has a lyophilic property to a lens solution, so that the lens layer 130 has the smallest thickness in its center and the largest thickness at its edge.

Figure 13:
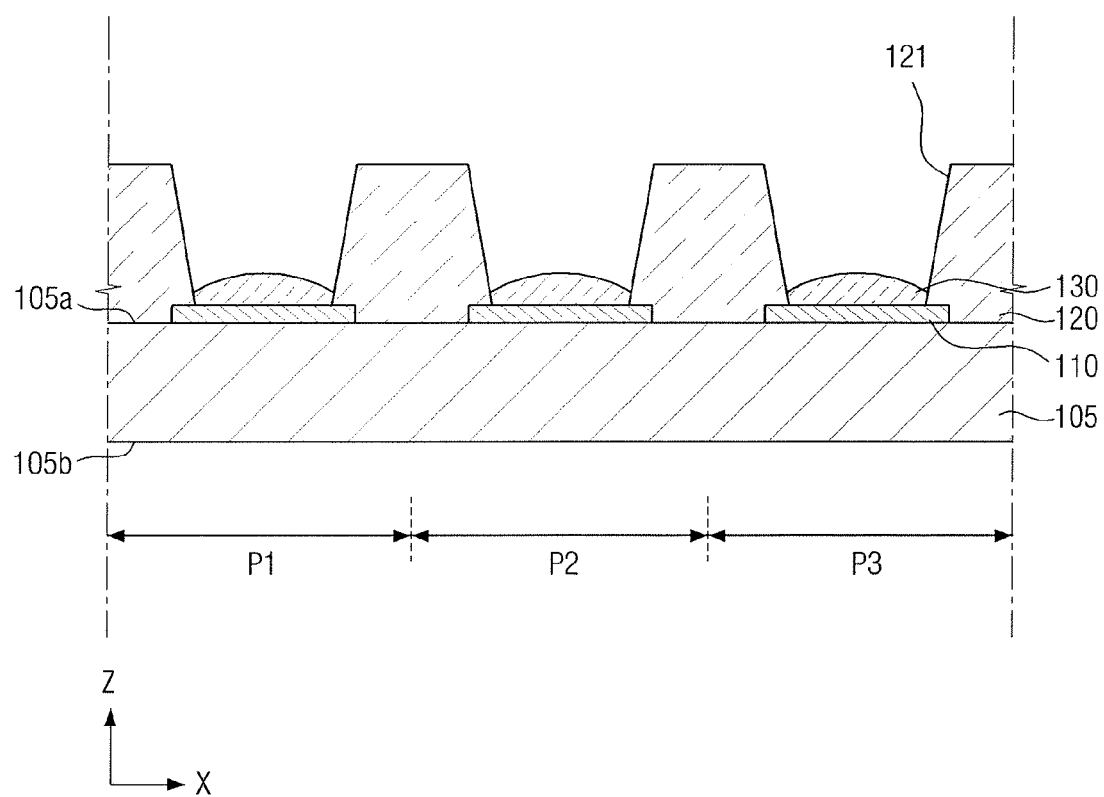

Referring to FIGS. 12 and 13, the lens layer 130 may be formed on the first electrode 110 in the pixel opening 121.

As shown in FIG. 12, a lens solution 130a containing a lens material may be ejected into the pixel opening 121 of the pixel defining layer 120 by using an inkjet print method or a nozzle print method, for example. Since the pixel defining layer 120 has a lyophobic property to the lens solution 130a, the lens solution 130a may have a convex shape with the center thicker than the edge without spreading out to the edge on the first electrode 110. The lens solution 130a may be dried, forming the lens layer 130 shown in FIG. 13. The lens layer 130 may be formed, for example, by a simple print method by varying a contact angle made by the lens solution 130a and the pixel defining layer 130, without requiring any dedicated patterning.

Figure 14:
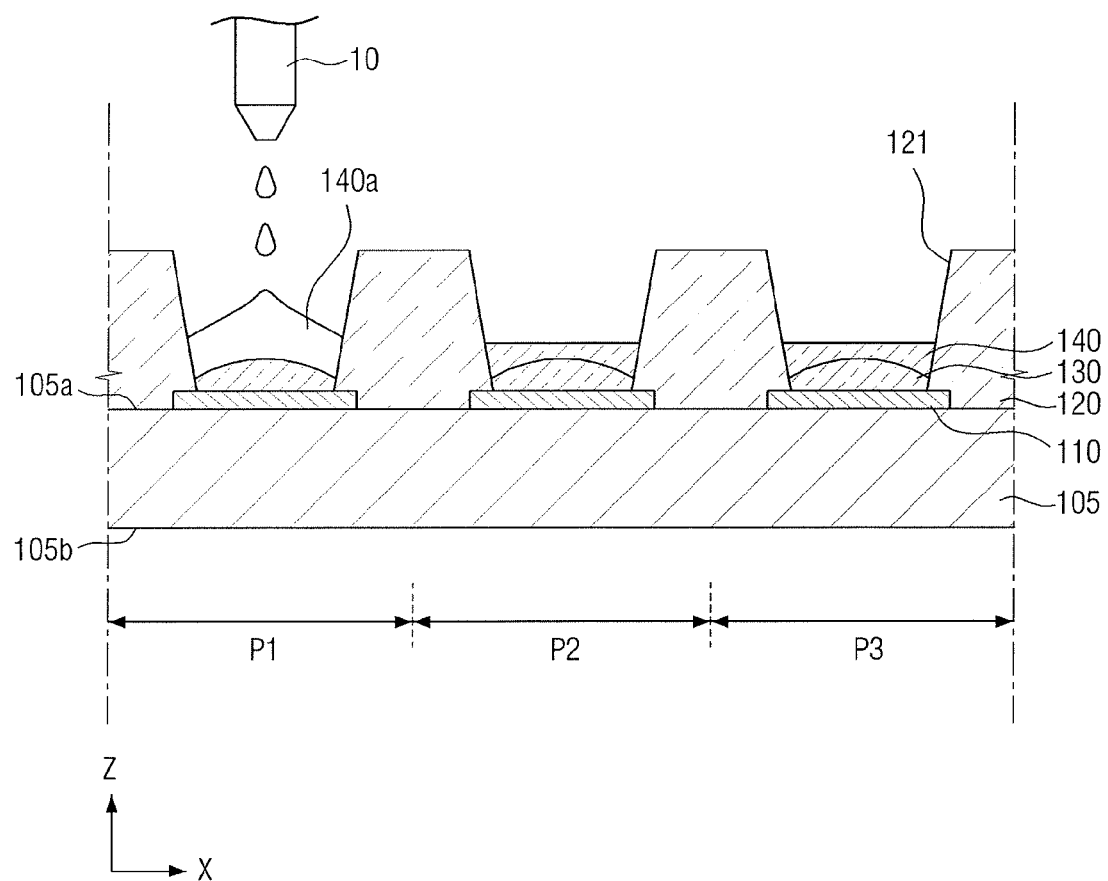
Figure 15:
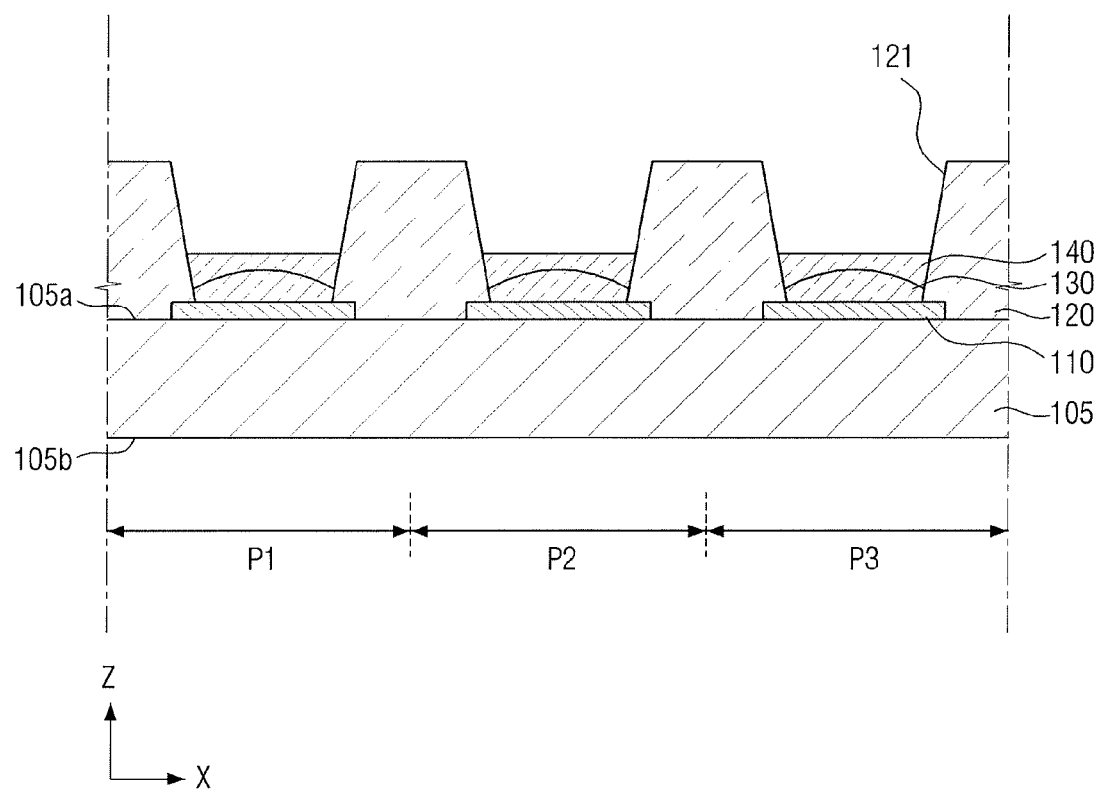

Referring to FIGS. 14 and 15, a planarization layer 140 having a flat surface may be formed on the lens layer 130 in the pixel opening 121.

As shown in FIG. 14, a lens solution 140a containing a lens material may be ejected into the pixel opening 121 of the pixel defining layer 120 by using an inkjet print method or a nozzle print method, for example. The lens solution 140a may be dried, forming the planarization layer 140 shown in FIG. 15. The lens solution 140a may be the same as the lens solution 130a (see FIG. 12) used in forming the lens layer 130 (see FIG. 13). The flat surface of the planarization layer 140 may be formed by adjusting drying conditions of the lens solution 140a.

Figure 16:
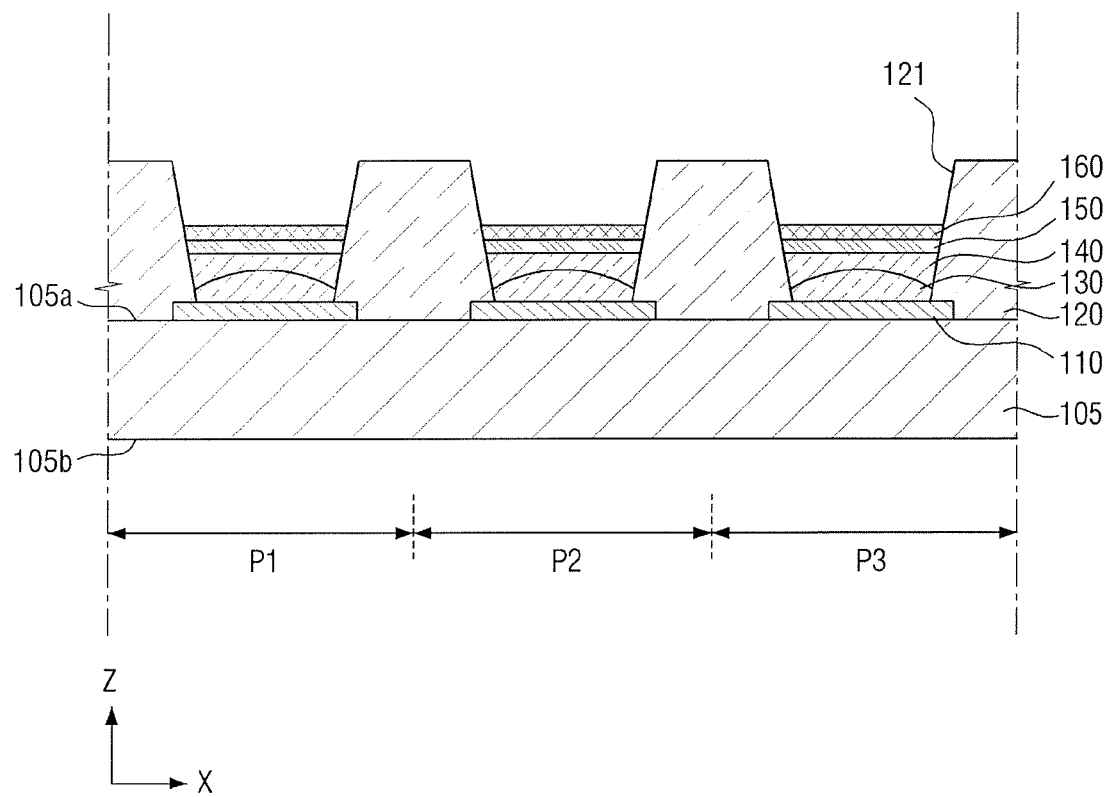

Referring to FIG. 16, a hole transport layer 150 may be formed on the planarization layer 140, and a light emitting layer 160 may be formed on the hole transport layer 150. The hole transport layer 150 and the light emitting layer 160 may be formed by, but are not limited to, an inkjet print method or a nozzle print method. For example, the hole transport layer 150 and the light emitting layer 160 may be formed by a deposition method.

Figure 17:
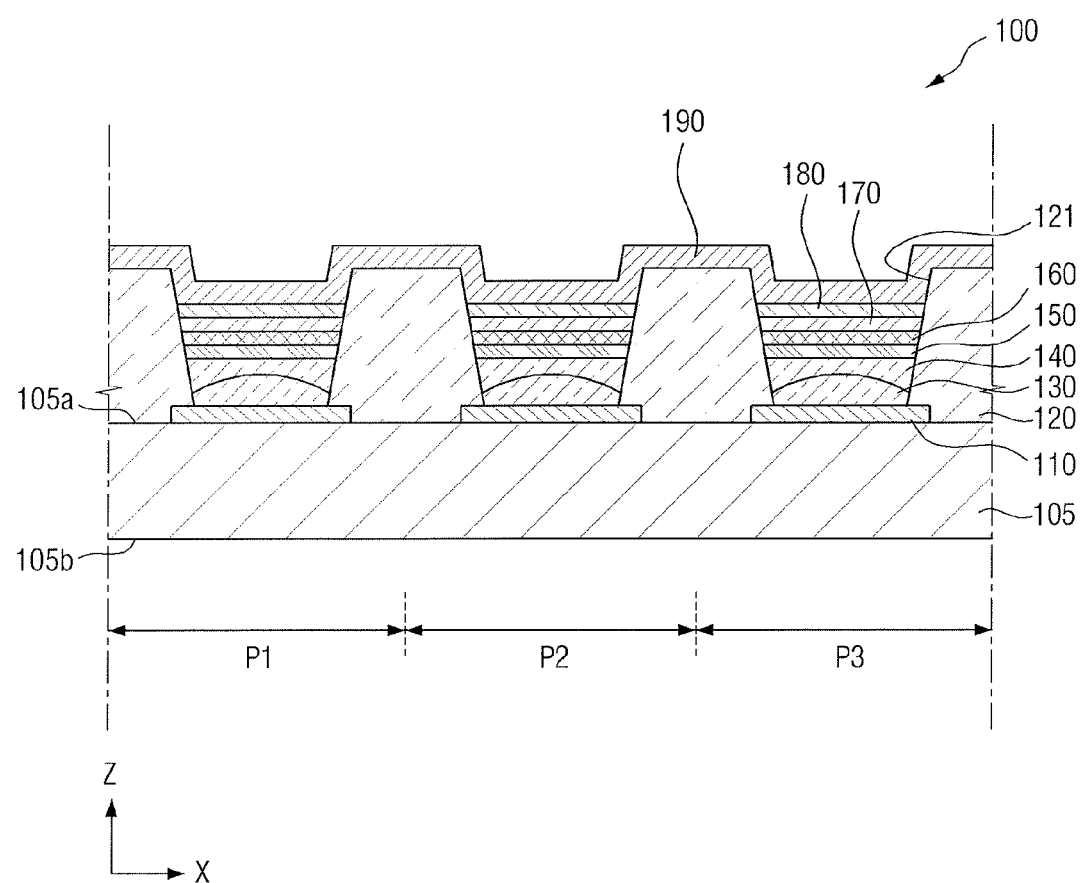

Referring to FIG. 17, an electron transport layer 170 may be formed on the light emitting layer 160, an electron injecting layer 180 may be formed on the electron transport layer 170, and a second electrode 190 may be formed on the electron injecting layer 180. The electron transport layer 170, the electron injecting layer 180 and the second electrode 190 may be formed by a deposition process, for example.

The method of fabricating a light-emitting display device according to an exemplary embodiment may further include disposing a sealing substrate on the second electrode 190. In addition, the method of fabricating a light-emitting display device according to an exemplary embodiment may further include disposing a spacer between the sealing substrate and the second electrode 190. A suitable method of disposing the sealing substrate and the spacer may be used.

By way of Summation and review, an organic light-emitting display device may include a lens layer disposed on the substrate that may improve the extraction efficiency of light emitted from a light emitting layer or may improve the viewing angle. The lens layer may be formed by a photolithography process using a photo mask.

However, such a photolithography process using a photo mask may be complicated. Moreover, the shape and size of a lens layer may need to change depending on characteristics of an organic light-emitting display device, e.g., different light extraction efficiency or viewing angle. To that end, the photo mask may need to be replaced, which may be cumbersome.

Exemplary embodiments may provide a light-emitting display device including a lens layer that may be formed by a simple method, and may improve light extraction efficiency or viewing angle.

Exemplary embodiments may also provide a method of fabricating a light-emitting display device including a lens layer that may be formed by a simple method, and may improve light extraction efficiency or viewing angle.

Exemplary embodiments may provide a light-emitting display device that may improve light extraction efficiency or viewing angle by virtue of a lens layer that may be formed by a simple method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light-emitting display device, comprising:
   a substrate including a plurality of pixel areas arranged in a first direction and a second direction intersecting the first direction;
   a first electrode on the substrate in each of the plurality of pixel areas;
   a plurality of pixels corresponding to the first electrode in each of the plurality of pixel areas;
   a pixel defining layer on the substrate having a pixel opening exposing the first electrode;
   a lens layer on the first electrode in the pixel opening, a thickness in a center of the lens layer being different from a thickness at an edge of the lens layer;
   a planarization layer on the lens layer in the pixel opening and having a flat surface facing away from the lens layer;
   a light emitting layer on the planarization layer; and
   a second electrode on the light emitting layer.

2. The light-emitting display device as claimed in claim 1, wherein a surface of the lens layer that faces the planarization layer is a curved surface being closer to the light emitting layer at the center than at the edge of the lens layer, and
   wherein the thickness in the center of the lens layer is a largest thickness of the lens layer and the thickness at the edge of the lens layer is a smallest thickness of the lens layer.

3. The light-emitting display device as claimed in claim 2, wherein the plurality of pixels include a first pixel and a second pixel emitting light of different colors, and
   wherein the lens layer in the first pixel has the largest thickness in the center of the lens layer and the second pixel has a largest thickness of the lens layer in the center different from the largest thickness in the center of the lens layer in the first pixel.

4. The light-emitting display device as claimed in claim 2, wherein the lens layer is formed by ejecting a hole injection solution containing a hole injection material onto the first electrode and drying the hole injection solution, and
   wherein the pixel defining layer includes an insulative material that has a lyophobic property to the hole injection solution.

5. The light-emitting display device as claimed in claim 1, wherein a surface of the lens layer that faces the planarization layer is a curved surface being closer to the light emitting layer at the edge that at the center of the lens layer, and
   wherein the thickness in the center of the lens layer is a smallest thickness of the lens layer and the thickness at the edge of the lens layer is a largest thickness of the lens layer.

6. The light-emitting display device as claimed in claim 5, wherein the lens layer is formed by ejecting a hole injection solution containing a hole injection material onto the first electrode and drying the hole injection solution, and wherein the pixel defining layer includes an insulative material that has a lyophilic property to the hole injection solution.

7. The light-emitting display device as claimed in claim 1, wherein the planarization layer includes a same material as the lens layer.

8. The light-emitting display device as claimed in claim 1, wherein the first electrode includes a transparent electrode material and the second electrode includes a reflective electrode material.

9. A light-emitting display device, comprising:
a substrate including a plurality of pixel areas arranged in a first direction and a second direction intersecting the first direction, the substrate having a first surface and a second surface facing the first surface;
a first electrode on the first surface of the substrate in each of the pixel areas;
a plurality of pixels corresponding to the first electrode in each of the plurality of pixel areas;
a pixel defining layer on the first surface of the substrate and having a pixel opening exposing the first electrode;
a light emitting layer on the first electrode;
a second electrode on the light emitting layer;
a partitioning wall on the second surface of the substrate and having a partitioning wall opening exposing a part of the second surface of the substrate corresponding to the first electrode; and
a lens layer on the second surface of the substrate in the partitioning wall opening,
wherein a thickness in a center of the lens layer is different from a thickness at an edge of the lens layer.

10. The light-emitting display device as claimed in claim 9, wherein a surface of the lens layer exposed via the partitioning wall opening is a curved surface closer to the light emitting layer at the center that at the edge of the lens layer, and
wherein the thickness in the center of the lens layer is a smallest thickness of the lens layer and the thickness at the edge of the lens layer is a largest thickness of the lens layer.

11. The light-emitting display device as claimed in claim 10, wherein the plurality of pixels includes a first pixel and a second pixel emitting light of different colors, and
wherein the lens layer in the first pixel has the smallest thickness in the center of the lens layer and the second pixel has a smallest thickness of the lens layer in the center different from the smallest thickness in the center of the lens layer in the first pixel.

12. The light-emitting display device as claimed in claim 10, wherein the lens layer is formed by ejecting a lens solution containing a lens material onto the second surface of the substrate and drying the lens solution, and
wherein the partitioning wall includes an insulative material that has a lyophilic property to the lens solution.

13. The light-emitting display device as claimed in claim 9, wherein a surface of the lens layer exposed via the partitioning wall opening is a curved surface closer to the light emitting layer at the edge than at the center of the lens layer, and
wherein the thickness in the center of the lens layer is a largest thickness of the lens layer and the thickness at the edge of the lens layer is a smallest thickness of the lens layer.

14. The light-emitting display device as claimed in claim 13, wherein the lens layer is formed by ejecting a lens solution containing a lens material onto the second surface of the substrate and drying the lens solution, and
wherein the partitioning wall includes an insulative material that has a lyophobic property to the lens solution.

15. The light-emitting display device as claimed in claim 9, wherein the first electrode includes a transparent electrode material and the second electrode includes a reflective material.

16. A method of fabricating a light-emitting display device, the method comprising:
forming a first electrode in each of a plurality of pixel areas arranged on a substrate in a first direction and a second direction intersecting the first direction such that a corresponding plurality of pixels is formed;
forming a pixel defining layer on the substrate, the pixel defining layer defining each of the pixels and having a pixel opening exposing the first electrode;
forming a lens layer on the first electrode in the pixel opening, a thickness in a center of the lens layer being different from a thickness at an edge of the lens layer;
forming a planarization layer on the lens layer in the pixel opening such that the planarization layer has a flat surface facing away from the lens layer;
forming a light emitting layer on the planarization layer; and
forming a second electrode on the light emitting layer.

17. The method as claimed in claim 16, wherein forming the lens layer and forming the planarization layer includes ejecting a lens solution into the pixel opening using an ink print method or a nozzle print method and drying the lens solution.

18. The method as claimed in claim 17, wherein forming the lens layer includes ejecting a hole injection solution containing a hole injection material as the lens solution onto the first electrode and drying the hole injection solution, and
wherein the pixel defining layer includes an insulative material that has a lyophobic property to the hole injection solution.

19. The method as claimed in claim 17, wherein forming the lens layer includes ejecting a hole injection solution containing a hole injection material onto the first electrode and drying the hole injection solution, and
wherein the pixel defining layer includes an insulative material that has a lyophilic property to the hole injection solution.

20. The method as claimed in claim 17, wherein forming the lens layer and forming the planarization layer are performed using a same lens solution.

* * * * *